United States Patent [19]

Miller

[11] Patent Number: 4,516,036
[45] Date of Patent: May 7, 1985

[54] LINEAR RAMP VOLTAGE GENERATOR CIRCUIT

[75] Inventor: Richard D. Miller, Lancaster, Pa.

[73] Assignee: RCA Corporation, Princeton, N.J.

[21] Appl. No.: 443,927

[22] Filed: Nov. 23, 1982

[51] Int. Cl.³ .......................... H03K 4/08; H03K 4/86
[52] U.S. Cl. ..................................... 307/228; 307/239; 307/247 R; 328/181
[58] Field of Search ................... 307/228, 246, 247 R, 307/239; 328/181–185; 323/326, 288

[56] References Cited
U.S. PATENT DOCUMENTS 3,049,625  8/1962  Brockman ........................... 307/239
3,619,649  11/1971  Hoffman ............................. 328/184

Primary Examiner—Stanley D. Miller
Assistant Examiner—B. P. Davis
Attorney, Agent, or Firm—Eugene M. Whitacre; Dennis H. Irlbeck; Vincent J. Coughlin, Jr.

[57] ABSTRACT

A generating circuit for producing a linear ramp output voltage comprises an electronic switch and a ramp circuit connected to the electronic switch. The ramp circuit includes a single active component having first and second input terminals and an output terminal. The ramp circuit has positive and negative feedback to the input terminals of the active component.

2 Claims, 1 Drawing Figure

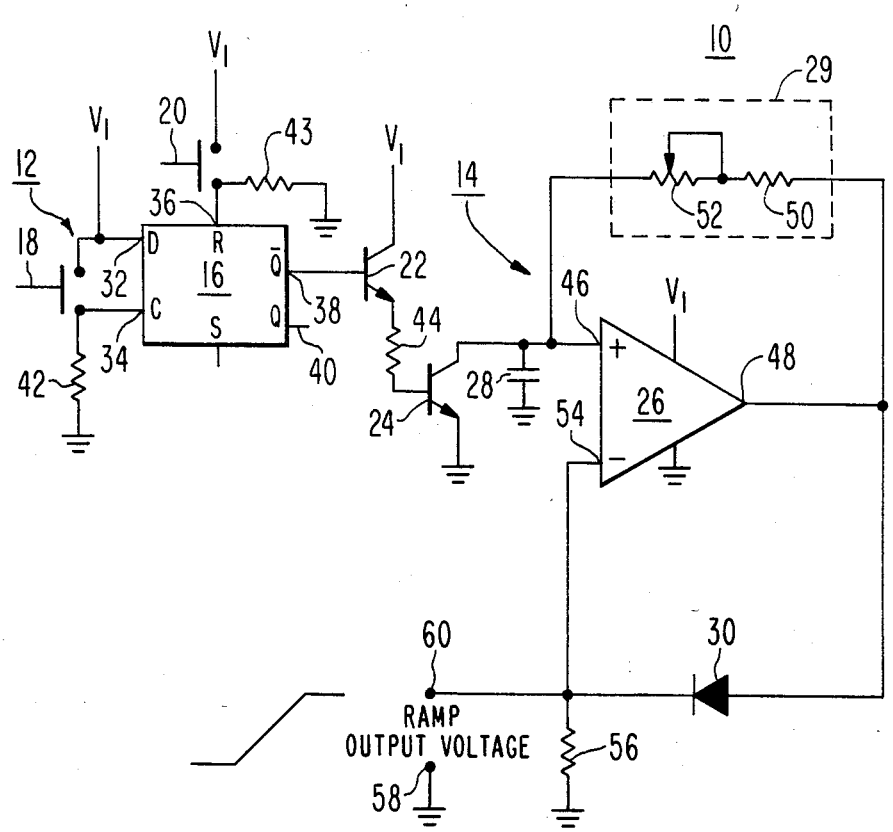

LINEAR RAMP VOLTAGE GENERATOR CIRCUIT

BACKGROUND OF THE INVENTION

The invention relates to a ramp voltage generator circuit and, more particularly, to a linear ramp voltage generator circuit comprising an electronic switch and a ramp circuit which utilizes an operational amplifier having positive and negative feedback to provide an output voltage which is linear with time.

Ramp voltage generator circuits are used to provide ramp voltages which increase at a predetermined linear rate. Such ramp voltages may be used to externally control, for example, the horizontal deflection of an oscilloscope, or a plotter. The ramp circuitry that is currently known requires a plurality of active components, i.e., components which require an applied voltage. Such a ramp circuit is shown in U.S. Pat. No. 4,029,972, issued to Fox et al. on June 14, 1977. The Fox et al. ramping circuit utilizes two operational amplifiers to provide a ramp voltage from a square wave input. As the number of active components in a ramping circuit increase, the power requirements of the circuit also increase, and the usefulness of the circuit in low power applications, such as in battery operated equipment, decreases. Thus, it is desirable that the ramp circuit of a ramp voltage generator has a minimum number of active components while providing a linear output.

It is also desirable that the electronic switch portion of the ramp voltage generator be activated and reset manually. Such manual operation is useful where test equipment is to be externally controlled, and data is to be recorded.

SUMMARY OF THE INVENTION

A generating circuit for producing a linear ramp output voltage comprises switching means and a ramp circuit connected to the switching means. The ramp circuit includes a single active component having first and second input terminals and an output terminal. The ramp circuit also includes feedback means to each of said input terminals of said active component.

BRIEF DESCRIPTION OF THE DRAWING

The FIGURE is a complete circuit diagram of the preferred embodiment of the invention.

DETAILED DESCRIPTION OF THE PREFERRED EMBODIMENT

The FIGURE shows a linear ramp voltage generator circuit 10 comprising an electronic switch 12 and a ramp circuit 14. The electronic switch 12 includes a logic chip 16, a ramp button 18, a reset button 20, a first transistor 22 and a second transistor 24. The ramp circuit 14 includes an operational amplifier 26, a charging capacitor 28, a feedback network 29 and a feedback diode 30.

The logic chip 16 includes a pair of input terminals 32 and 34, a reset terminal 36, and a pair of output terminals 38 and 40. The input terminal 32 is connected to a positive potential, $V_1$, and also to one side of the ramp button 18. The input terminal 34 is connected to the other side of the ramp button 18 which, through a resistor 42, is returned to a plane of reference potential, here indicated as ground. The reset terminal 36 is connected to one side of the reset button 20 and through a resistor 43 to the plane of reference potential. The other side of the reset button 20 is connected to the positive potential, $V_1$. The output terminal 38 of the logic chip 16 is connected to the base of the first transistor 22. The collector of the transistor 22 is connected to the positive potential, $V_1$, and the emitter of the transistor 22 is connected through a resistor 44 to the base of the second transistor 24. The emitter of the second transistor 24 is connected to the plane of the reference potential while the collector of the second transistor 24 is connected to the common terminal of the charging capacitor 28 and to a first, or positive, input terminal 46 of the operational amplifier 26. The other terminal of the charging capacitor 28 is connected to the plane of the reference potential. The amplifier 26 is also provided with appropriate terminals for connecting to the positive potential, $V_1$, and to the plane of the reference potential, shown as ground. As output terminal 48 of the operational amplifier 26 provides positive feedback to the positive input terminal 46 of the amplifier 26 through the feedback network 29 comprising a feedback resistor 50 and a feedback potentiometer 52 connected in series. The output terminal 48 of the amplifier 26 also provides negative feedback, through the feedback diode 30, to a second, or negative, input terminal 54 of the amplifier 26. A load resistor 56 is connected between the negative input terminal 54 of the amplifier 26 and the plane of the reference potential. The linear ramp output voltage is available across circuit output terminals 58 and 60.

In the operation of the linear ramp voltage generator circuit 10, the normally open ramp button 18 is closed so that potential $V_1$ is applied to both of the input terminals 32 and 34 of the logic chip 16. With potential $V_1$ applied to both input terminals, the output of the logic chip 16 at the output terminal 38 is zero, thereby turning off the transistors 22 and 24. The positive input terminal 46 of the operational amplifier 26 is therefore at zero since it is connected to the collector of the second transistor 24. However, since a potential, $V_1$, is provided to the amplifier 26, the output at the terminal 48 of the amplifier 26 increases and provides a positive feedback through the resistor 50 and the potentiometer 52 to the positive input terminal 46 and charges the capacitor 28. Because the positive and negative inputs to the operational amplifier 26 are differentially coupled, and the amplifier 26 has a high open loop gain, the output voltage, $V_o$, at the terminal 48 of the amplifier 26 will provide a voltage that maintains the negative input at the terminal 54 at the same voltage as the positive input at the terminal 46. Therefore, the voltage, $V_o$, at the output terminal 48 of the amplifier 26 is equal to the sum of the voltage drop, $V_D$, across the feedback diode 30 plus the voltage, $V_P$, applied to the positive input terminal 46 of the amplifier 26. This requires that the voltage drop across the positive feedback network 29, comprising the feedback resistor 50 and the feedback potentiometer 52, be equal to the voltage drop, $V_D$, across the diode 30. The voltage drop across the feedback network 29 provides a constant charging current for the charging capacitor 28. The magnitude of the charging current is equal to the voltage drop, $V_D$, across the feedback diode 30 divided by the resistance of the positive feedback network 29, which, in this instance, is the sum of the series resistance of the resistor 50 and the potentiometer 52. It is well known that when a capacitor is charged with a constant current, the voltage across it is a ramp which is linear with time. The ramp rate $V/t$, for a given value of capacitance for the capacitor 28, is determined by the product of the resistive and capacitive impedances in accordance with the relationship that the ramp rate in volts per second is equal to the voltage drop, $V_D$, across the feedback diode 30 divided by the product of the resistance of the network 29 ($R_{50}+R_{52}$) and the capacitance, C, of the capacitor 28: $V/t=V_D/(R_{50}+R_{52})C$. The ramp rate will be maintained at the aforedescribed rate until the operational amplifier 26 saturates. The ramp rate may be changed by varying the resistance of potentiometer 52.

The ramp output voltage is reset to zero by actuating the reset button 20 to apply a potential, $V_1$, to the reset terminal 36 of the logic chip 16. A voltage approximately equal to $V_1$ is then applied, over output terminal 38 of the logic chip 16, to the base of the base of the first transistor 22 to turn on first transistor 22 and second transistor 24. The charging capacitor 28 then discharges through the second transistor 24 to ground, and the ramp output voltage drops to zero.

As an explicit example, and without limiting the invention in any way, the following specific values for the circuit components shown in the drawing were utilized to construct the linear ramp generator circuit 10.

| | | |
|---|---|---|
| Resistors 42, 43 | 10 kilohms | |
| Resistor 44 | 62 kilohms | |
| Resistor 50 | 20 kilohms | |
| Resistor 56 | 4.7 kilohms | |
| Potentiometer 52 | 1000 kilohms, ajustable | |
| Logic Chip 16 | RCA CD 4013 | |
| Operational Amplifier 26 | RCA CA 3140 | |
| Transistors 22, 24 | 2N2222 | |
| Capacitor 28 | 2.2 microfarads | |
| Diode 30 | IN914 | |
| Voltage, $V_1$, | 5 volts | |

What is claimed is:

1. A generating circuit for producing a linear ramp output voltage comprising:

a logic chip having first and second input terminals, a reset terminal, and first and second output terminals;

a first transistor having a base, a collector, and an emitter, said base of said first transistor being connected to said first output terminal of said logic chip;

a second transistor having a base, a collector, and an emitter;

a first resistor connected between the emitter of said first transistor and the base of said second transistor;

a capacitor connected between said collector of said second transistor and ground;

an operational amplifier having first and second input terminals and an output terminal, said first input terminal being connected to said collector of said second transistor;

means for connecting said input terminals and said reset terminal of said logic chip, said collector of said first transistor, and said operational amplifier to a voltage source;

a feedback network connected between said first input terminal and said output terminal of said operational amplifier;

a feedback diode connected between said second input terminal and said output terminal of said operational amplifier; and linear ramp output voltage means comprising a pair of output terminals connected across a load resistor, said load resistor having two terminals, one terminal of said load resistor being connected between said second input terminal of said operational amplifier and said feedback diode, the other terminal of said load resistor being connected to ground.

2. The generating circuit as in claim 1, wherein said feedback network comprises a second resistor and a third resistor, one of said resistors being adjustable.

* * * * *